(12) United States Patent
Komatsu

(10) Patent No.: US 6,359,312 B1
(45) Date of Patent: Mar. 19, 2002

(54) SEMICONDUCTOR DEVICE WITH SOI STRUCTURE

(75) Inventor: Hiroshi Komatsu, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/631,942

(22) Filed: Aug. 3, 2000

Related U.S. Application Data

(62) Division of application No. 09/071,837, filed on May 4, 1998.

(30) Foreign Application Priority Data

| May 14, 1997 | (JP) | ................................ 9-124327 |
| Sep. 5, 1997 | (JP) | ................................ 9-241221 |

(51) Int. Cl.[7] .................... H01L 27/01; H01L 27/12; H01L 31/0392
(52) U.S. Cl. .................... 257/354; 257/347; 257/366
(58) Field of Search .................... 257/347, 354, 257/365, 366

(56) References Cited

U.S. PATENT DOCUMENTS 5,612,552 A * 3/1997 Owens ........................ 257/202
5,877,046 A * 3/1999 Yu et al. ...................... 438/151
5,952,694 A * 9/1999 Miyawaki et al. ........... 257/347

FOREIGN PATENT DOCUMENTS

| JP | 4-307972 | * 10/1992 | .................. 257/365 |
| JP | 5-21797 | * 1/1993 | .................. 257/365 |

* cited by examiner

Primary Examiner—Ngân V. Ngô
(74) Attorney, Agent, or Firm—Rader, Fishman & Grauer PLLC; Ronald P. Kananen, Esq.

(57) ABSTRACT

Disclosed is a semiconductor device including a SOI substrate having a SOI layer, in which a structure made from a semiconductor device is buried; a thick oxide film formed on the structure by selectively oxidizing the structure using as a mask an oxidation preventive film formed both on the SOI layer and on a region in which a contact reaching the structure is to be formed; an interlayer dielectric film formed on the structure, the SOI layer and the thick oxide film; and a plurality of connection holes formed in the interlayer dielectric film and including at least a connection hole positioned on the region in which the contact is to be formed. With this semiconductor device, a contact reaching a back gate electrode can be formed without increasing an aspect ratio of the contact even when a thick oxide film is grown on the back gate electrode in the filed area by selectively oxidizing the back gate electrode in the field area.

6 Claims, 12 Drawing Sheets

SEMICONDUCTOR DEVICE WITH SOI STRUCTURE

This application is a divisional of application Ser. No. 09/071,837 filed May 4, 1998.

BACKGROUND OF THE INVENTION

1. FIELD OF THE INVENTION

The present invention relates to a SOI type semiconductor device using a bonded and etch-backed SOI substrate produced by selective polishing using a stopper, and a process of fabricating the same. In particular, the present invention relates to a SOIMOSFET having a structure such as a back gate electrode formed in a SOI substrate, and a process of fabricating the same.

2. DESCRIPTION OF THE RELATED ART

It has been known that a SOI (Silicon On Insulator) structure makes easy perfect isolation of elements and suppresses occurrence of a soft error and latch up inherent to a CMOSTr (Complementary Metal Oxide Semiconductor Transistor), and it has been relatively early examined to realize a high speed and high reliability CMOSTr-LSI by means of a SOI structure including a Si active layer having a thickness of about 500 nm.

In recent years, it has become apparent that the performances of the SOI structure can be more improved, for example, in terms of suppression of a short channel effect and enhancement of a current driving ability of the MOSTr by thinning a surface Si layer of the SOI structure to about 100 nm and controlling an impurity concentration in a channel at a relatively low value, thereby substantially depleting the entire Si active layer.

As a method for forming such a SOI layer, there has been known two relatively high level processes: a SIMOX (Separation by IMplanted OXygen) process and a wafer bonding process.

Each of these two processes, however, has a merit and a demerit at the present time. For example, a SOI substrate prepared by the SIMOX process is excellent in uniformity of thickness of a SOI film; however, it is poor in flatness at an interface with a buried oxide film, to degrade a reliability of a transistor. Besides, a SOI substrate prepared by the wafer bonding process is excellent in characteristic at an interface with a buried oxide film; however, it is particularly poor in uniformity of a thickness of a thin Si film.

Here, there will be briefly described steps of fabricating a SOI substrate in accordance with the wafer bonding process.

A SOI substrate is fabricated, in accordance with the wafer bonding process, by planarization-polishing and surface-treating a surface of an A substrate to be bonded, bonding a B substrate to the A substrate and annealing the bonded substrates A and B, and grinding and polishing the A substrate (selectively polishing, in the case of using a stopper). In the case of polishing the A substrate using a stopper, a stepped portion (which becomes a stopper layer) must be previously formed on the A substrate (which becomes the final SOI layer) before planarization-polishing the surface of the A substrate to be bonded.

The bonded and etch-backed wafer thus prepared is effective not only to relatively freely set a thickness of a buried oxide film and the like, but also to prepare a LSI in a state in which elements, interconnections, and the like are previously buried on the back side of the B substrate before bonding of the A substrate to the B substrate and hence to prepare a LSI of a higher degree of integration.

For example, in fabrication of a MOSFET, by burying a gate electrode (this is often called a back gate electrode) in a SOI substrate, it is possible not only to suppress a short channel effect and control a threshold voltage (Vth) and swing of a voltage in a transistor but also to apply the MOSFET to a X-MOS (a MOSTr allowing to simultaneously operate a front gate and a back gate, which is also called a "Double Gate MOS").

Incidentally, the related art process of fabricating a semiconductor device has the following problems. Now, there will be reviewed these problems along with description of the related art fabrication process.

FIG. 26A is a sectional view showing a process of fabricating a semiconductor device.

First, as shown in FIG. 26A, a photoresist film (not shown) is provided on a silicon substrate (A substrate) in a region in which a SOI layer 50 is to be formed. It should be noted that the positional relationship in the vertical direction shown in FIG. 26A is reversed to that in this description. The A substrate is anisotropically etched by RIE (Reactive Ion Etching) using the photoresist film as a mask, to form a stepped portion for forming the SOI layer 50 on the A substrate. In addition, the process of forming such a stepped portion is called a trench process (by anisotropic etching using RIE).

A back gate oxide film 53 is formed on the A substrate, and a back gate electrode 55 is formed on the back gate oxide film 53. On the back gate electrode 55 is deposited an interlayer insulating film ($SiO_2$ film) 57 on which a poly-Si film (not shown) is formed. Then, the poly-Si film is planarized by polishing, and a supporting substrate (B substrate) 60 is bonded with the planarized surface of the poly-Si film.

The A substrate is polished from the back surface side using the back gate oxide film 53 as a stopper (this is called selective polishing), to prepare a semiconductor substrate (SOI substrate) having the SOI layer 50, in which the back gate electrode 55 is buried.

A sacrifice oxide film (not shown) is formed by sacrifice oxidation on the surface of the SOI layer 50 exposed by the above selective polishing. The sacrifice oxidation is performed to recover the surface state of the SOI layer 50 coarsened by selective polishing.

On both the sacrifice oxide film and the back gate oxide film 53 is provided a silicon nitride film (oxidation preventive film, not shown) positioned on the SOI active layer 50.

Next, by selectively oxidizing the back gate electrode 55 using the silicon nitride film (oxidation preventive film) as a mask, a thick oxide film 71 is formed on the back gate electrode 55. At this time, the back gate electrode 55 is oxidized through an oxide film grown from the back gate oxide film 53 by sacrifice oxidation. Then, both the silicon nitride film and the sacrifice oxide film are removed, to expose the surface of the SOI layer 50.

A front gate oxide film 61 is formed on the surface of the SOI layer 50, and a front gate electrode 75 is formed on both the front gate oxide film 61 and the thick oxide film 71. The step is followed by formation of a LDD (Lightly Doped Drain) region, a LDD-spacer ($SiO_2$), and a diffusion layer.

Then, an interlayer insulating film 81 is formed on both the thick oxide film 71 and the front gate electrode 75. In both the interlayer dielectric film 81 and the thick oxide film 71 are formed contact holes in which tungsten (W) plugs 77 are buried. And, aluminum (Al) interconnections 79 are formed on both the W plugs 77 and the interlayer insulating film 81. In this state, one Al interconnection 79 is connected to the front gate electrode 75 through one W plug 77 and the other Al interconnection 79 is connected to the back gate electrode 55 through the other W plug 77.

The above-described fabrication process is characterized by forming the oxidation preventive mask on a portion of the SOI region and selectively oxidizing the back gate electrode 55, thereby making it possible to suppress a parasitic capacitance from being increased in the field area at a portion in which the front gate 75 is superimposed on the back gate electrode 55.

However, in the case where the back gate electrode 55 in the field area is entirely oxidized as described above, as shown in FIG. 26A, upon formation of the first contact, the connection hole in which the W plug 77 connected to the back gate electrode 55 is to be buried is required to be formed in such a manner as to be deeper in thickness corresponding to that of the thick oxide film 71 than the connection hole in which the W plug 77 connected to the front gate electrode 75 is to be buried. As a result, an aspect ratio of the contact hole reaching the back gate electrode 55 is increased, so that there may occur a void 77a in the W plug 77. This causes a problem that a contact resistance between the back gate electrode 55 and the W plug 77 at a portion 83 shown in FIG. 26A is increased.

FIG. 26B is a sectional view showing another process of fabricating a semiconductor device. In this figure, parts corresponding to those shown in FIG. 26A are indicated by the same reference numerals in FIG. 26A, and the explanation thereof is omitted. Hereinafter, there will be described only part of a configuration of this process different from that of the process shown in FIG. 26A.

In this process, the front gate electrode 75 does not cover a portion over the SOI layer 50, and a contact hole is provided in the interlayer dielectric film 81 at a position corresponding to that of the above portion over the SOI layer 50. The W plug 77 is formed in the connection hole. In this state, one Al interconnection 79 is connected to the SOI layer 50 through the W plug 77.

In the above-described process of fabricating a semiconductor device, when the contact hole in which the W plug 77 connected to the back gate electrode 55 is to be buried and the connection hole in which the W plug 77 connected to the SOI layer 50 is to be buried are simultaneously opened, there may occur a problem that the SOI layer 50 may be entirely etched off because of selectivity upon etching by RIE due to a difference in depth between the contact holes (see a portion 85 in FIG. 26B). This causes a problem of lowering a yield in burying the W plug 77 in the contact hole reaching the SOI layer 50. Additionally, since the contact hole in which the W plug 77 connected to the back gate electrode 55 is to be buried is required to be formed in such a manner as to be deeper by the thickness corresponding to that of the thick oxide film 71 than the contact hole connected to the SOI layer 50 is to be buried, there. may occur a void 77a in the W plug 77.

Accordingly, there has been strong demands to develop a fabrication process capable of suppressing a parasitic capacitance from being increased in the field area at a portion between the front gate electrode 75 and the back gate electrode 55 by selectively oxidizing the back gate electrode 55 in the field area while preventing an increase in an aspect ratio of a contact hole reaching the back gate electrode 55.

FIG. 27A is a sectional view of a semiconductor device fabricated by a process similar to that shown in FIG. 26A, illustrating another problem; and FIG. 27B is a sectional view of a semiconductor device fabricated by a process similar to that shown in FIG. 26B, illustrating another problem. In these figures, parts corresponding to those shown in FIGS. 26A and 26B are indicated by the same reference numerals as those in FIGS. 26A and 26B.

As shown in FIGS. 27A and 27B, in the case where the back gate electrode 55 formed of the poly-Si film having a thickness of less than 300 nm is oxidized from the front surface side for forming the thick oxide film 71, the back gate electrode 55 in which grains of poly-Si have been grown at high temperatures through wafer bonding process is oxidized, and accordingly, oxidation of the back gate electrode 55 abnormally proceeds along grain boundaries of poly-Si. For example, in the case where the poly-Si film (back gate electrode 55) having the initial thickness of less than 300 nm is oxidized a thickness of less than 200 nm to form the oxide film 71 having a thickness of less than 400 nm for suppressing a parasitic capacitance in the field area at a portion between the front gate electrode 75 and the back gate electrode 55, the remaining thickness of the poly-Si film becomes less than 100 nm. At this time, if the poly-Si film is abnormally oxidized along grain boundaries, the remaining thickness of the poly-Si film is very thinned (see a portion 101 in FIG. 27A), with a result that a local sheet resistance may be finally increased. In the worst case, as oxidation of the back gate electrode 55 further proceeds, there may occur an inconvenience that the poly-Si film (back gate electrode 55) may be disconnected (see a portion 103 in FIG. 27B).

In the case where the back gate electrode 55 is made from p+poly-Si doped with boron (B), since boron as a dopant is precipitated at an interface between the poly-Si film 55 and the oxide film ($SiO_2$ film) 71 during oxidation of the back gate electrode 55, a final sheet resistance Rs of the back gate electrode 55 is increased more than that of the thinned poly-Si film.

In view of the foregoing, there have been strong demands to provide a semiconductor device capable of suppressing a parasitic capacitance from being increased in a field area at a portion between a front gate electrode 75 and a back gate electrode 55 by selectively oxidizing the back gate electrode 55 in the field area and also capable of suppressing a disconnection or an increase in sheet resistance of the back gate electrode 55 in the field area, and to provide a process of fabricating the semiconductor device.

SUMMARY OF THE INVENTION

An object of the present invention is to provide a semiconductor device capable of forming a contact reaching a back gate electrode without increasing an aspect ratio of the contact even if a thick oxide film is grown on the back gate electrode in a field area by selectively oxidizing the back gate electrode in the field area, and a process of fabricating the semiconductor device.

Another object of the present invention is to provide a semiconductor device capable of suppressing a disconnection or an increase in sheet resistance of a back gate electrode or structure even if a thick oxide film is grown on the back gate electrode or structure in a field area by selectively oxidizing the back gate electrode or structure in the field area, and a process of fabricating the semiconductor device.

To achieve the above objects, according to the present invention, there is provided a semiconductor device of a SOI type in which a structure made from a semiconductor material is buried, including: an oxide film selectively grown on the structure except for a partial region of the structure.

According to the present invention, there is also provided a semiconductor device including: a SOI substrate having a SOI layer, in which a structure made from a semiconductor material is buried; a thick oxide film formed on the structure by selectively oxidizing the structure using as a mask an oxidation preventive film formed both on the SOI layer and on a region in which a contact reaching the structure is to be formed; an interlayer dielectric film formed on the structure, the SOI layer and the thick oxide film; and a plurality of connection holes formed in the interlayer insulating film and including at least a connection hole positioned on the region in which the contact is to be formed.

In the semiconductor device of the present invention, when a thick oxide film is formed on a structure except for a partial region of the structure, an oxidation preventive mask is formed not only on a SOI active region but also on a portion in which a contact reaching the structure is to be formed for preventing oxidation of such a portion as well as the SOI active region. As a result, even when the thick oxide film is grown on the structure in the field area, the portion in which the contact is to be formed is substantially at the same level of the SOI layer, so that it is possible to prevent an increase in an aspect ratio of a connection hole.

DETAILED DESCRIPTION OF THE INVENTION

Hereinafter, preferred embodiments of the present invention will be described with reference to the accompanying drawings.

EMBODIMENTS 1 AND 2

Figure 1A:
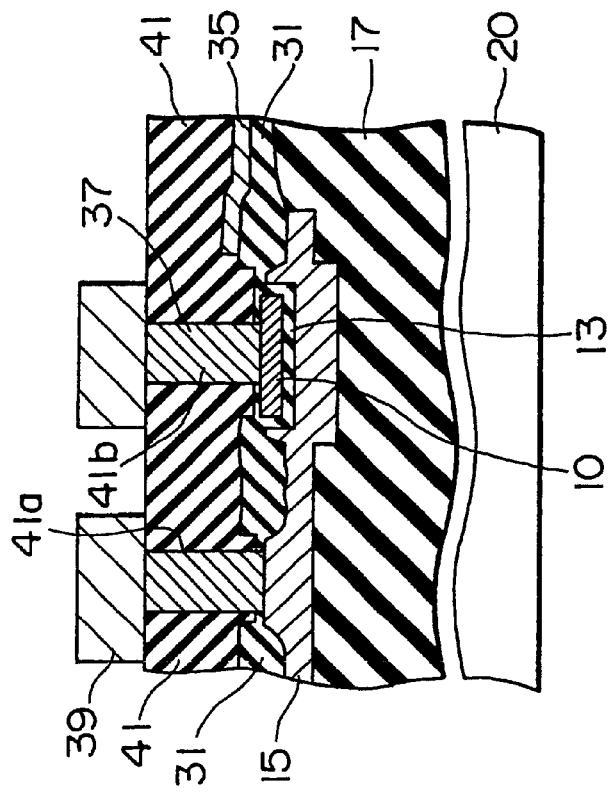
FIG. 1A is a sectional view showing a semiconductor device according to a first embodiment of the present invention.

FIG. 1A is a sectional view showing a semiconductor device according to a first embodiment of the present invention. A poly-Si film (not shown) is provided on a supporting substrate (B substrate) 20, and an interlayer dielectric film ($SiO_2$ film) 17 is formed on the poly-Si film.

A structure made from a semiconductor material, for example, a back gate electrode 15 is formed on a portion the interlayer dielectric film 17, and a back gate oxide film 13 is formed on the back gate electrode 15. On both the back gate electrode 15 and the interlayer dielectric film 17 is formed a thick oxide film 31 at a portion other than both a region in which a SOI layer 10 is to be formed and a region in which a contact hole 41a (which will be described later) connected to the back gate electrode 15 is to be formed.

The SOI layer 10 is formed on the back gate oxide film 13, and a front gate oxide film 33 is formed on the SOI layer 10. On both the front gate oxide film 33 and the thick oxide film 31 is formed a front gate electrode 35.

On both the front gate electrode 35 and the thick oxide film 31 is provided an interlayer dielectric film 41 in which contact holes (connection holes) 41a and 41b connected to the back gate electrode 15 and the front gate electrode 35 are provided, respectively. Tungsten (W) plugs 37 are buried in the contact holes 41a and 41b, and aluminum (Al) interconnections 39 are formed on the W plugs 37 and the interlayer dielectric film 41. In this state, one Al interconnection 39 is connected to the back gate electrode 15 through one W plug 37, and the other Al interconnection 39 is connected to the front gate electrode 35 through the other W plug 37.

A process of fabricating the above-described semiconductor device will be described below.

The back gate electrode 15 formed of the poly-Si film having a thickness of about 300 nm is buried before formation of the bonded and etch-backed SOI substrate. After formation of the bonded and etch-backed SOI substrate, the back gate electrode 15 is oxidized a thickness (of the poly-Si film) of less than 200 nm in the field area. The oxidation allows the oxide film 31 to grow a thickness of less than 400 nm. The remaining thickness of the poly-Si film forming the back gate electrode 15 in the field area becomes a value of less than 100 nm. In addition, since oxidation is performed after formation of an oxidation preventive mask on the SOI active region for preventing oxidation of the SOI active region, the thickness of the poly-Si film (back gate electrode 15) at a portion directly under the SOI layer is left as the initial value of less than 300 nm.

On the other hand, since the back gate electrode 15 is oxidized in a state in which a region in which a contact is to be formed to reach the back gate electrode 15 from the front surface side is also covered with an oxidation preventive mask, the thickness of the poly-Si film (back gate electrode 15) at such a portion is similarly left as the initial value of less than 300 nm.

Figure 1B:
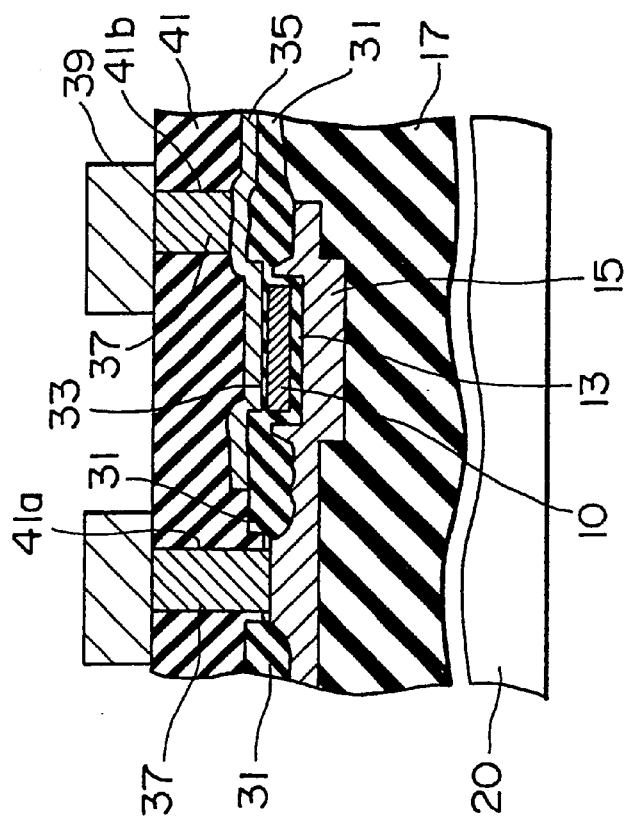
FIG. 1B is a sectional view showing a semiconductor device according to a second embodiment of the present invention.

FIG. 1B is a sectional view showing a semiconductor device according to a second embodiment of the present invention. In this embodiment, parts corresponding to those in the first embodiment shown in FIG. 1A are indicated by the same reference numerals as those in FIG. 1A, and the explanation thereof is omitted. Hereinafter, there will be described only part of a configuration of the second embodiment different from that of the first embodiment.

Contact holes (connection holes) 41a and 41b to be respectively connected to a back gate electrode 15 and a SOI layer 10 are formed in an interlayer dielectric film 41. In these contact holes 41a and 41b are buried W plugs 37. In this state, one Al interconnection 39 is connected to the back gate electrode 15 through the W plug 37, and the other Al interconnection 39 is connected to the SOI layer 10 through the W plug 37.

FIGS. 2 to 9 are sectional views showing a process of fabricating the semiconductor device shown in FIG. 1A, in which a thick oxide film is formed on a back gate electrode region except for the SOI region and respective contacts are simultaneously formed by selectively oxidizing the back gate electrode in the field area after formation of an oxide mask on a region in which a contact reaching the back gate electrode is to be formed and on the SOI active layer.

Figure 2:
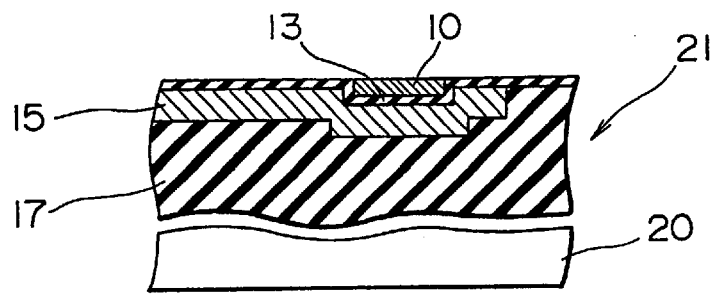
FIGS. 2 to 9 are sectional views showing sequential steps of fabricating the semiconductor device shown in FIG. 1A.

First, as shown in FIG. 2, a photoresist film (not shown) is formed on a silicon substrate (A substrate) in a region in which a SOI layer 10 is to be formed. It is to be noted that the positional relationship in the vertical direction shown in FIG. 2 is reversed to that in this description. The A substrate is anisotropically etched by RIE using the photoresist film as a mask, to form a stepped portion for forming the SOI layer 10. In addition, the process of forming such a stepped portion is called a trench process.

A back gate oxide film 13 having a thickness of about 60 nm (for a device of a 0.18 μm rule) is formed on the A substrate, and a back gate electrode (doped poly-Si film as a structure) 15 having a thickness of about 300 nm is formed on the back gate oxide film 13. An interlayer dielectric film ($SiO_2$ film) 17 is deposited on the back gate electrode 15, and a poly-Si film (not shown) is deposited on the interlayer dielectric film 17. The poly-Si film is planarized by polishing, and a supporting substrate (B substrate) 20 is bonded on the surface of the planarized poly-Si film. The A substrate is selectively polished from the back surface side using the back gate oxide film 13 as a stopper, to prepare a bonded and etch-backed SOI substrate (semiconductor substrate) 21 having the SOI layer 10 in which the back gate electrode 15 as the structure is buried.

Figure 3:
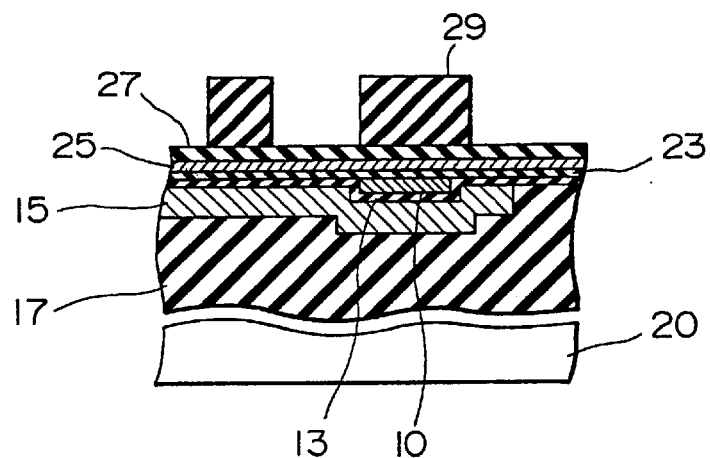

As shown in FIG. 3, a sacrifice oxide film 23 having a thickness of about 30 nm is formed on the SOI layer 10 by sacrifice oxidation. A poly-Si film (pad poly-Si film) 25 having a thickness of about 50 nm is deposited on the sacrifice oxide film 23, and a silicon nitride film ($Si_3N_4$ film) 27 having a thickness of about 100 nm is deposited on the poly-Si film 25. A photoresist film 29 is then formed on the silicon nitride film 27. The photoresist film 29 is a resist mask pattern for allowing the silicon nitride film 27 as an oxidation preventive mask to remain on both the SOI active layer 10 and a portion in which a W plug 37 (which will be described later) is to be connected to the back gate electrode 15. Accordingly, to prevent oxidation of the SOI layer 10 and the portion in which the W plug 37 is to be connected to the back gate electrode 15, sizes of respective patterns of the photoresist film 29 at both the SOI layer 10 and the contact portion are required to be wider than sizes of both the SOI layer 10 and the contact portion.

Here, the size of the pattern of the resist mask 29 at the contact portion may be determined in consideration of the amount of a bird's beak upon oxidation of the back gate (this is dependent on the oxidation condition and the thickness of the oxide film), the alignment accuracy of lithography, and the like.

Figure 4:
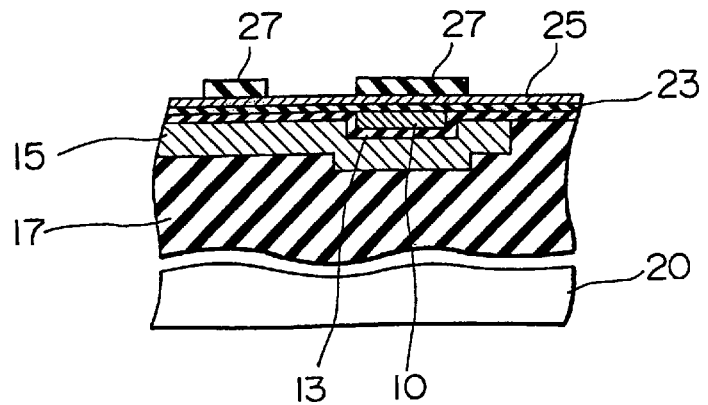

As shown in FIG. 4, the silicon nitride film 27 is etched by RIE using the photoresist film 29 as a mask and using the poly-Si film 25 as a stopper, followed by removal of the photoresist film 29.

Figure 5:
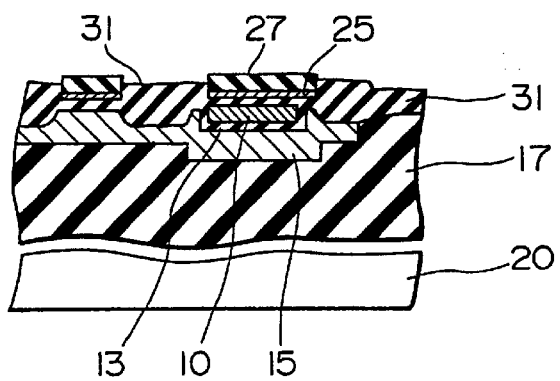

Then, as shown in FIG. 5, the back gate electrode 15 is selectively oxidized using the silicon nitride film (oxidation preventive film) 27 as an oxidation preventive mask, to form a thick oxide film 31 on the back gate electrode 15. At this time, the poly-Si film 25 is first oxidized, and then the back gate electrode 15 is oxidized through the back gate oxide film grown by sacrifice oxidation. The oxidized amount may be determined in consideration of the remaining thickness of the back gate electrode after oxidation, cut-off of the oxide film in the field area depending on the processed amount of a HF based solution (which will be described later) after oxidation, and the like. Here, about 100 nm of the thickness (300 nm) of the back gate electrode 15 is oxidized, so that the remaining thickness of the back gate electrode 15 in the field area becomes about 200 nm. Since the poly-Si film 25 is all oxidized at this time, the thickness of the oxide film on the back gate electrode 15 in the field area becomes about 360 nm {[50 nm (thickness of the poly-Si film 25)+100 nm (consumption of the back gate electrode 15)]×2+60 nm=360 nm}.

The oxidation condition may be set that the temperature is 950° C.; the atmosphere is $H_2/O_2$=5/5 slm; and the oxidation time is 2.5 hr. Also the oxide film 31 is formed to be thicker than the gate oxide film 13.

Figure 6:
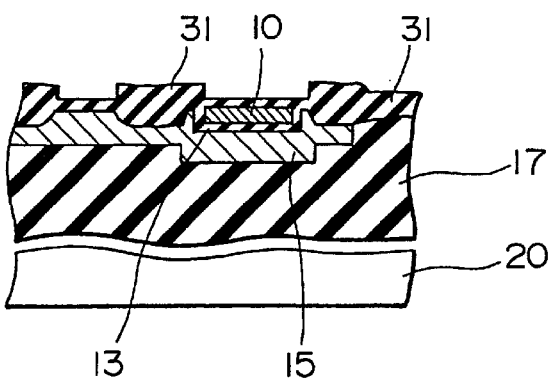

Then, as shown in FIG. 6, the silicon nitride film 27 is removed by etching using boiled phosphoric acid, and the poly-Si film 25 is also removed by isotropic dry etching.

Figure 7:
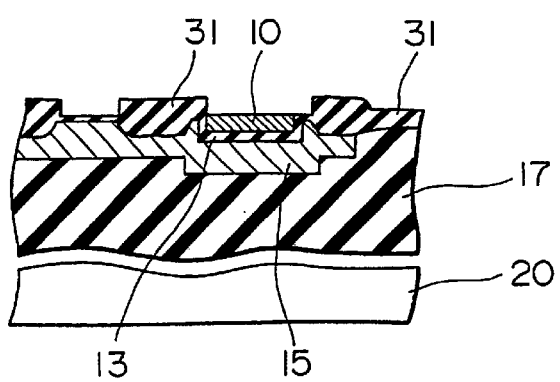

As shown in FIG. 7, the sacrifice oxide film 23 is removed by a HF based solution, to expose the surface of the SOI layer 10.

Figure 8:
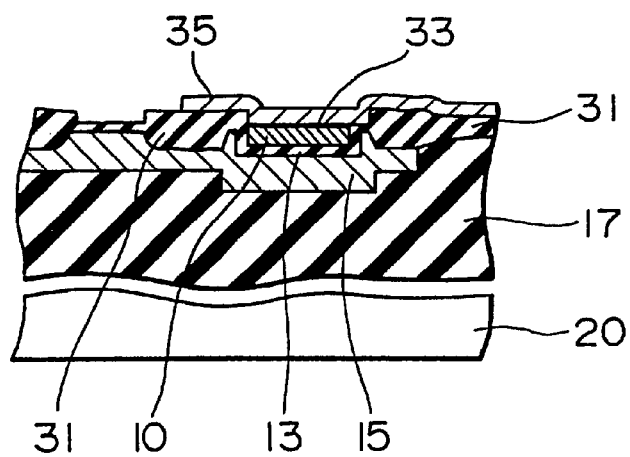

After that, as shown in FIG. 8, a front gate oxide film 33 is formed on the surface of the SOI layer 10, and a front gate electrode 35 is formed on both the front gate oxide film 33 and the thick oxide film 31.

The step is followed by formation of a LDD region (not shown), a LDD-spacer ($SiO_2$), and a diffusion layer.

Figure 9:
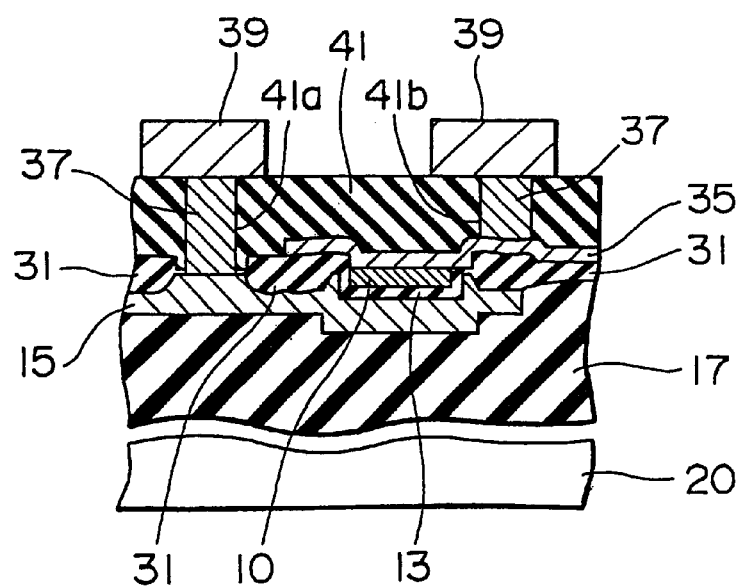

As shown in FIG. 9, an interlayer dielectric film 41 is deposited on both the thick oxide film 31 and the front gate electrode 35. Connection holes (contact holes) 41a and 41b are formed in the interlayer dielectric film 41, and are then buried with W plugs 37. On both the W plugs 37 and the interlayer dielectric film 41 are formed Al interconnections 39. In this state, one Al interconnection 39 is connected to the front gate electrode 35 through one W plug 37 and the other Al interconnection 39 is connected to the back gate electrode 15 through the other W plug 37.

Here, the above-described determination of the size of the silicon nitride film (oxidation preventive mask) 27 shown in FIG. 4 will be described in detail.

The size of the oxidation preventive mask 27 formed at the contact portion may be determined only in consideration of a misalignment upon lithography and a critical dimension loss caused by RIE and oxidation. That is, the size may be determined not in consideration of expansion/contraction of the pattern due to bonding of the substrates because the oxidation preventive mask and the contact are both formed after bonding of the substrates.

Further, in the SOI type semiconductor device, a junction leak current is not increased even if there occurs a positional offset between the portion in which the oxidation preventive mask 27 is to be formed and the portion in which the contact is to be formed, so that the dimension and process of the oxidation preventive mask 27 may be designed only in consideration of a variation in contact resistance due to increase/decrease in contact area.

For example, in the case of applying a fixed bias to the back gate electrode 15, a pattern size of the oxidation preventive mask 27 formed at the contact portion is set at a value of 0.6 μm×0.6 μm and an opening size of the contact (connection hole 41a shown in FIG. 9) is set at a value of 0.4 μm×0.4 μm. In this case, assuming that the critical dimension loss of the oxidation preventive mask 27 upon RIE is put aside, since the poly-Si (back gate electrode 15) is eroded a dimension of less than 0.2 μm by the bird's beak upon oxidation of the back gate electrode 15 shown in FIG. 5, only a region of the poly-Si 15 having a size of 0.2 μm×0.2 μm remains after oxidation. In other words, only the region of the back gate electrode 15 having the size of 0.2 μm×0.2 μm has the initial thickness (300 nm). Accordingly, by forming a resist pattern of the contact with an alignment margin (3 σ) of the stepper being set at less than 0.15 μm, an area of the contact portion becomes a value of 0.2 82 m×0.2 μm (=0.04 μm²) even if there occurs a misalignment upon photography.

On the other hand, in the case of operating the device with a potential of the back gate electrode 15 changed at a high speed, the oxidation preventive mask 27 is required to be formed into a size of, for example, 1 μm ×1 μm. With this size of the oxidation preventive mask 27, even if the poly-Si film (back gate electrode 15) is eroded a dimension of less than 0.2 μm during oxidation and a misalignment of less than 0.15 μm occurs, it is possible to ensure a sufficient area (0.4 μm×0.4 μm=0.16 μm²) of the contact portion by forming the contact having an opening size of 0.4 μm×0.4 μm. As a result, the contact resistance can be stably reduced, and thereby it does not exert any effect on high speed operation of the device.

In the process of fabricating a semiconductor device according to the first embodiment, since the silicon nitride film (oxidation preventive film) 27 is provided not only on the SOI layer 10 but also on the contact region reaching the back gate electrode 15, it is possible to prevent oxidation of the back gate electrode 15 at the contact region when the back gate electrode 15 is selectively oxidized using the silicon nitride film 27 as a mask. This eliminates such a necessity that the contact hole in which the W plug 37 connected to the back gate electrode 15 is to be buried is formed in such a manner as to be deeper than the contact hole in which the W plug 37 connected to the front gate electrode 35 is to be buried. As a result, it is possible to suppress an increase in an aspect ratio of the contact hole (first contact) reaching the back gate electrode 15, and hence to prevent occurrence of voids in the W plug 37 (or reduce a occurrence probability of voids in the W plug 37) when the contact hole is buried with the W plug 37. This prevents an increase in contact resistance between the back gate electrode 15 and the W plug 37.

In other words, opening of the contact hole (connection hole) can be performed simultaneously with formation of contacts with other parts of the device, such as the front gate electrode. To be more specific, according to the present invention, formation of contacts to the back gate, SOI diffusion layer, and front gate can be performed only by one step. Further, since the oxidized amount of the back gate electrode is not affected by and does not affect formation of the contact, the feasibility in process design can be increased.

Further, the thick oxide film 31 is formed on back gate electrode region except for the SOI region 10 and the contact region reaching the back gate electrode 15 by selectively oxidizing the back gate electrode 15 in the field area using the mask alignment. As a result, the thick oxide film 31 is present even after removal of the sacrifice oxide film 23 formed on the SOI layer 10 by etching, so that it is possible to suppress an increase in parasitic capacitance at the porion in which the back gate electrode 15 is superimposed to the front gate electrode 35. This is effective to realize high speed operation, reduce power consumption, and further improve integration of the semiconductor device.

While in the process of fabricating a semiconductor device according to the first embodiment, formation of the thick oxide film 31 on the back gate electrode 15 region except for the SOI region 10 and the contact region reaching the back gate electrode 15 is performed using the mask alignment, the present invention is not limited thereto. For example, formation of the thick oxide film 31 may be performed by a method of depositing an insulating film such as a SiO₂ film over the entire surface, opening a resist only at both the SOI region and the contact region, and then etching the insulating film.

The numeral values indicating process conditions or the like used in the first embodiment can be suitably changed in accordance with a design rule of a desired semiconductor device.

Although in the first embodiment the structure buried in the SOI type semiconductor device is represented by the back gate electrode, the present invention is not limited thereto. For example, an interconnection layer or the like may be buried in the SOI type semiconductor device as the structure.

The semiconductor device according to the second embodiment, shown in FIG. 1B, can be fabricated in a process substantially similar to the process of fabricating a semiconductor device according to the first embodiment.

In the semiconductor device according to the second embodiment, even when the contact hole 41a in which the W plug 37 connected to the back gate electrode 15 is to be buried and the contact hole 41b in which the W plug 37 connected to the SOI layer 10 is to be buried are simultaneously opened, the SOI layer is not cut-off as in the related art semiconductor device because the depths of the contact holes 41a and 41b are nearly equal to each other. Accordingly, it is possible to simultaneously form the contacts connected to the SOI layer 10 and the back gate electrode 15, respectively.

In addition, according to the second embodiment shown in FIG. 1B, the contact connected to the back gate electrode 15 must be formed in such a manner as to be deeper by the thickness corresponding to that of the back gate oxide film 13 than the contact connected to the SOI diffusion layer. In the actual process of fabricating a semiconductor device, however, before formation of the front gate oxide film 33, SiO₂ in the field area is cut-off a total dimension of about less than 50 nm by formation of the sacrifice oxide film (for example, thickness: less than 30 nm) and its wet etching (for example, etched mount of less than 36 nm, that is, 20% over-etching), and over-etching upon etching back for the LDD-spacer (SiO₂), and consequently, the thickness of the back gate oxide film can be perfectly neglected upon actual formation of the contact by RIE.

In addition, the description of the semiconductor devices according to the first and second embodiments is for illustrative purposes only, and it is to be understood that the initial thickness of the back gate electrode, the thickness of the oxide film selectively grown in the field area, and the size of the oxidation preventive mask formed at the contact portion can be suitably changed in design in accordance with a desired semiconductor device or design rule.

EMBODIMENTS 3 AND 4

Figure 10A:
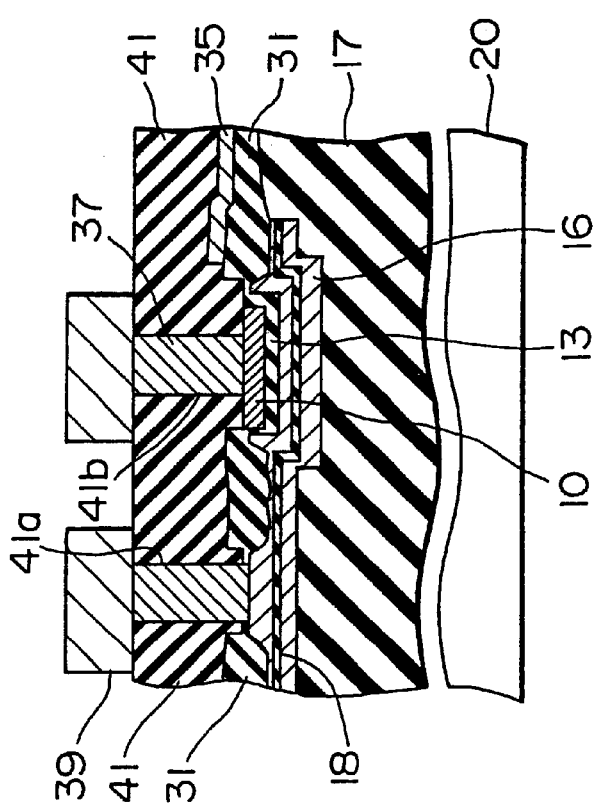
FIG. 10A is a sectional view showing a semiconductor device according to a third embodiment of the present invention.

FIG. 10A is a sectional view showing a semiconductor device according a third embodiment of the present invention. A poly-Si film (not shown) is formed on a supporting substrate (B substrate) 20, and an interlayer dielectric film (SiO₂ film) 17 is formed on the poly-Si film. A structure made from a semiconductor material, for example, a back gate electrode 16 is formed on a portion of the interlayer dielectric film 17. The back gate electrode 16 is formed of a poly-Si film having a total thickness of less than 300 nm. The poly-Si film, which constitutes the back gate electrode 16, contains a diffusion preventive layer for preventing diffusion of an impurity such as oxygen (O). The diffusion preventive layer is formed of, for example, a $Si_3N_4$ film 18 having a thickness of less than 2 nm. Accordingly, the back gate electrode 16 has a structure having an upper layer formed of the poly-Si film having a thickness of less than 200 nm, an intermediate layer formed of the $Si_3N_4$ film 18 having a thickness of less than 2 nm, and a lower layer formed of the poly-Si film having a thickness of less than 100 nm.

A back gate oxide film 13 is formed on the back gate electrode 16. On both the back gate electrode 16 and the interlayer dielectric film 17 is formed a thick oxide film 31 at a portion other than both a region in which a SOI layer 10 is to be formed and a region in which a contact hole 41*a* (which will be described later) connected to the back gate electrode 16 is to be formed.

The SOI layer 10 is formed on the back gate oxide film 13, and a front gate oxide film 33 is formed on the SOI layer 10. On both the front gate oxide film 33 and the thick oxide film 31 is formed a front gate electrode 35.

On both the front gate electrode 35 and the thick oxide film 31 is provided an interlayer dielectric film 41 in which contact holes (connection holes) 41*a* and 41*b* to be connected to the back gate electrode 16 and the front gate electrode 35, respectively are provided. Tungsten (W) plugs 37 are buried in the contact holes 41*a* and 41*b*, and aluminum (Al) interconnections 39 are formed on the W plugs 37 and the interlayer dielectric film 41. In this state, one Al interconnection 39 is connected to the back gate electrode 16 through one W plug 37, and the other Al interconnection 39 is connected to the front gate electrode 35 through the other W plug 37.

A process of fabricating the above-described semiconductor device will be described below.

The back gate electrode 16, which is formed of the poly-Si film having the total thickness of less than 300 nm, is buried before formation of the bonded and etchbacked SOI substrate. After formation of the bonded and etchbacked SOI substrate, the back gate electrode 16 is oxidized a thickness (of the poly-Si film) of less than 200 nm in the field area. The oxidation allows the oxide film 31 to grow a thickness of less than 400 nm. The remaining thickness of the poly-Si film forming the back gate electrode 16 in the field area becomes a value of less than 100 nm. In addition, since oxidation is performed after formation of an oxidation preventive mask on the SOI active region 10 for preventing oxidation of the SOI active region 10, the thickness of the poly-Si film (back gate electrode 16) at a portion directly under the SOI layer is left as the initial value of less than 300 nm.

On the other hand, since the back gate electrode 16 is oxidized in a state in which a region in which a contact is formed to reach the back gate electrode 16 from the front surface side is also covered with an oxidation preventive mask, the thickness of the poly-Si film (back gate electrode 16) at such a portion is similarly left as the initial value of less than 300 nm.

It should be noted that the structure of the back gate electrode and each film structure in the semiconductor device according to the third embodiment are described for illustrative purposes only, and therefore, they can be changed in design in accordance with a desired semiconductor device.

Figure 10B:
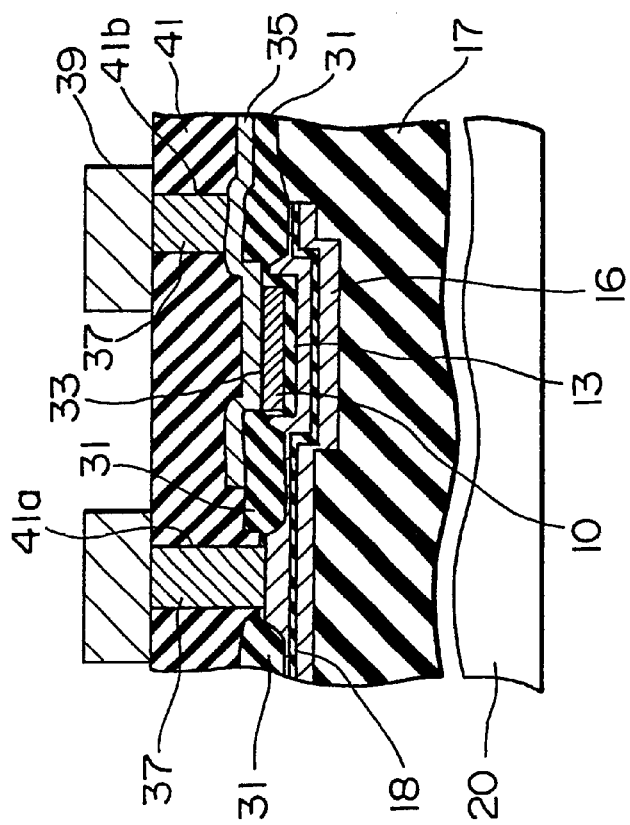
FIG. 10B is a sectional view showing a semiconductor device according to a fourth embodiment of the present invention.

FIG. 10B is a sectional view showing a semiconductor device according to a fourth embodiment of the present invention. In this embodiment, parts corresponding to those shown in FIG. 10A are indicated by the same reference numerals as those in FIG. 10A, and the explanation thereof is omitted. Hereinafter, there will be described only part of a configuration of the fourth embodiment different from that of the third embodiment.

In this fourth embodiment, contact holes (connection holes) 41*a* and 41*b* to be respectively connected to a back gate electrode 16 and a SOI layer 10 are formed in an interlayer dielectric film 41. In these contact holes 41*a* and 41*b* are buried W plugs 37. In this state, one Al interconnection 39 is connected to the back gate electrode 16 through the W plug 37, and the other Al interconnection 39 is connected to the SOI layer 10 through the W plug 37.

FIGS. 11 to 25 are sectional views showing a process of fabricating the semiconductor device shown in FIG. 10A, wherein FIGS. 11 to 17 are sectional views showing sequential steps before preparation of a SOI substrate (before bonding of SOI substrate) in the fabrication process; and FIGS. 18 to 25 are sectional views showing sequential steps after preparation of the SOI substrate (after bonding of the SOI substrate) in the fabrication process.

Figure 11:
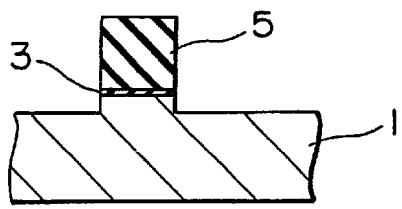
FIGS. 11 to 17 are sectional views showing sequential steps before preparation of a SOI substrate (before wafer bond and etch-back) in a process of fabricating the semiconductor device shown in FIG. 10A.

First, as shown in FIG. 11, a thermal oxide film ($SiO_2$ film) 3 having a thickness of less than 10 nm is formed on a silicon substrate (A substrate) 1. A photoresist pattern 5 is formed on the thermal oxide film 3 in a region in which a SOI layer is to be formed. The silicon substrate 1 and the thermal oxide film 3 are anisotropically etched by RIE using the photoresist pattern 5 as a mask, to form a stepped portion having a height of less than 0.1 $\mu$m on the surface of the silicon substrate 1. The stepped portion substantially determines the final thickness of the SOI film.

Figure 12:
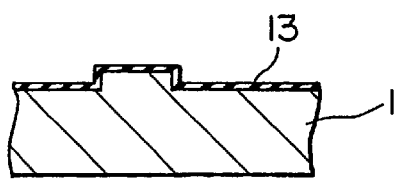

As shown in FIG. 12, the photoresist pattern 5 and the thermal oxide film 3 are removed. Then, a sacrifice oxide film (not shown) having a thickness of less than 30 nm is formed on the surface of the silicon substrate 1 for removing a damage layer which is formed on the surface of the silicon substrate 1 by the above-described etching, and then the sacrifice oxide film is entirely removed by wet etching. A back gate oxide film 13 having a thickness of less than 60 nm is formed on the silicon substrate 1.

Figure 13:
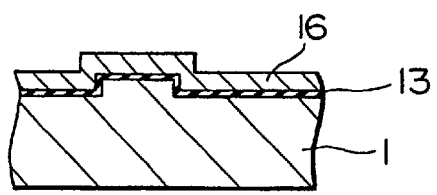

As shown in FIG. 13, a poly-Si film (doped poly-si film) 16*a* having a thickness of less than 200 nm, which is part of a back gate electrode, is formed on the back gate oxide film 13.

Figure 14:
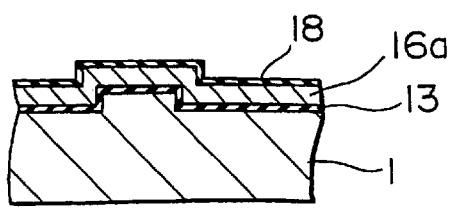

Then, as shown in FIG. 14, the poly-Si film 16*a* is directly nitrided, to form a thin $Si_3N_4$ film 18 having a thickness of less than 2 nm on the poly-Si film 16*a*. The forming condition of the $Si_3N_4$ film 18 (condition of nitriding the poly-Si film 16*a*) is set such that RTA processing is performed in a $NH_3$ atmosphere at a temperature of 850° C. for a processing time of 60 sec.

Figure 15:
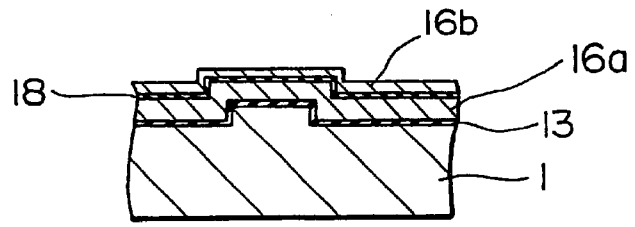

As shown in FIG. 15, on the thin $Si_3N_4$ film 18 is deposited a remaining poly-Si film 16*b* (thickness: less than 100 nm) which is part of the back gate electrode.

Figure 16:
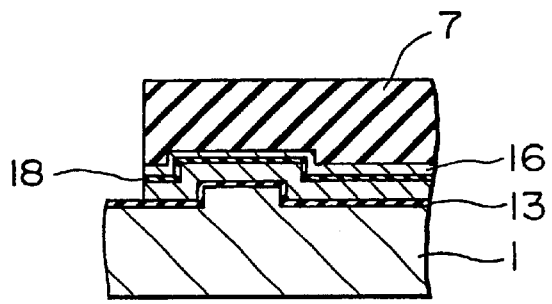

Then, as shown in FIG. 16, a photoresist pattern 7 is formed on the back gate electrode 16 composed of the poly-si films 16*a* and 16*b*. The back gate electrode 16 is patterned by etching using the photoresist pattern 7 as a mask.

Figure 17:
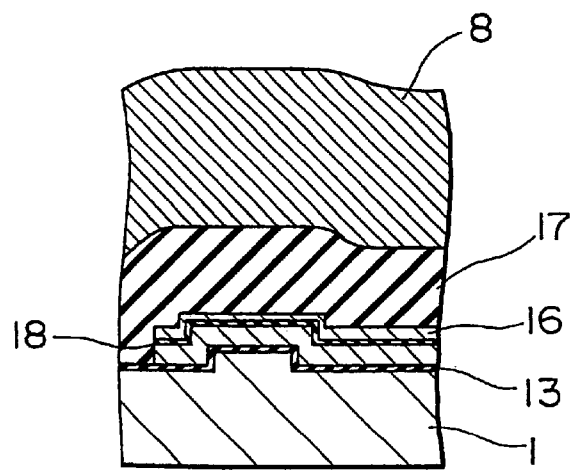

As shown in FIG. 17, the photoresist pattern 7 is removed, and an interlayer dielectric film 17 made from $SiO_2$ is formed on both the back gate electrode 16 and the back gate oxide film 13. Then, a poly-Si film 8 for wafer bonding is deposited on the interlayer dielectric film 17.

Figure 18:
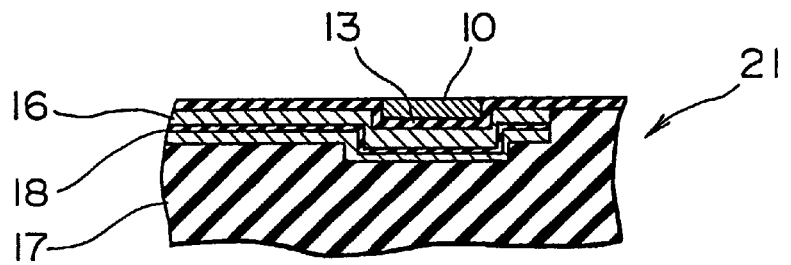
FIGS. 18 to 25 are sectional views showing sequential steps after preparation of the SOI substrate (after wafer bond and etch-back) in the process of fabricating the semiconductor device shown in FIG. 10A.

Next, a bonded SOI substrate is prepared by a process including: a step (a) of planarization-polishing and surface-treating a surface of the poly-Si film 8 to be bonded, bonding a supporting substrate (B substrate) on the surface of the poly-Si film 8; a step (b) of annealing the bonded substrates A and B; a step (c) of grinding the A substrate; and a step (d) of polishing the A substrate (selective polishing, in the case of using a stopper). To be more specific, as shown in FIG. 18, by selectively polishing the A substrate from the back surface side using the back gate oxide film 13 as a stopper, there is prepared a bonded SOI substrate 21 (semiconductor substrate) having the SOI layer 10, in which the back gate electrode 16 or structure is buried. It should be noted that the positional relationship in FIG. 18 is reversed to that in FIG. 17. In addition, at this time, device isolation is performed.

Figure 19:
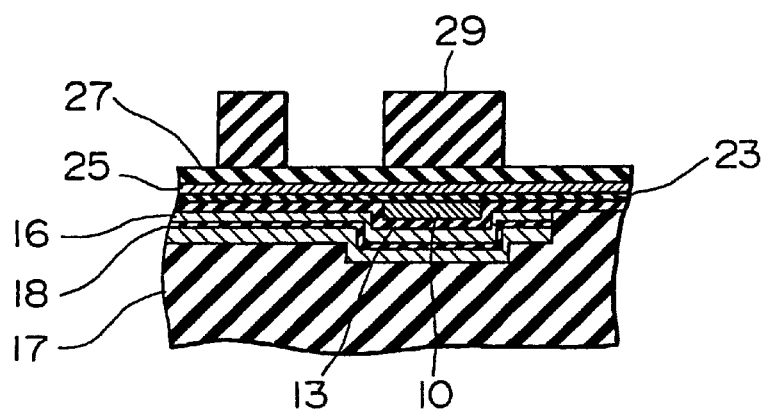

As shown in FIG. 19, a sacrifice oxide film (pad $SiO_2$ film) 23 having a thickness of less than 30 nm is formed on the SOI layer 10 by sacrifice oxidation. A poly-Si film (pad poly-Si film) 25 having a thickness of less than 50 nm is deposited on the sacrifice oxide film 23, and a silicon nitride film ($Si_3N_4$ film) 27 having a thickness of less than 100 nm is deposited on the poly-Si film 25. A photoresist film 29 is then formed on the silicon nitride film 27. The photoresist film 29 is a resist mask pattern for allowing the silicon nitride film 27 as an oxidation preventive mask to remain on both the SOI active layer 10 and on a portion in which a W plug 37 (which will be described later) is to be connected to the back gate electrode 16.

Figure 20:
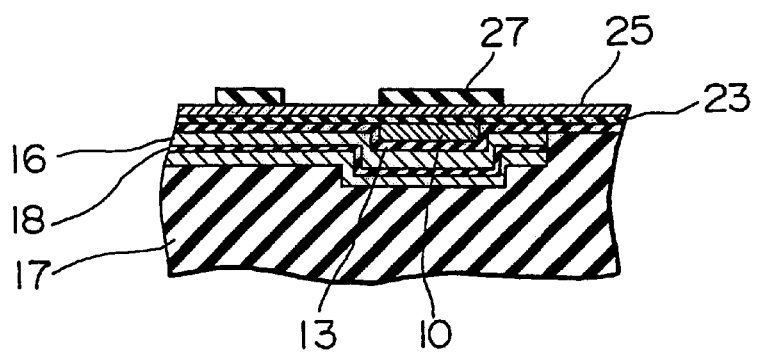

As shown in FIG. 20, the silicon nitride film 27 is etched by RIE using the photoresist film 29 as a mask and using the poly-Si film 25 as a stopper, followed by removal of the photoresist film 29.

Figure 21:
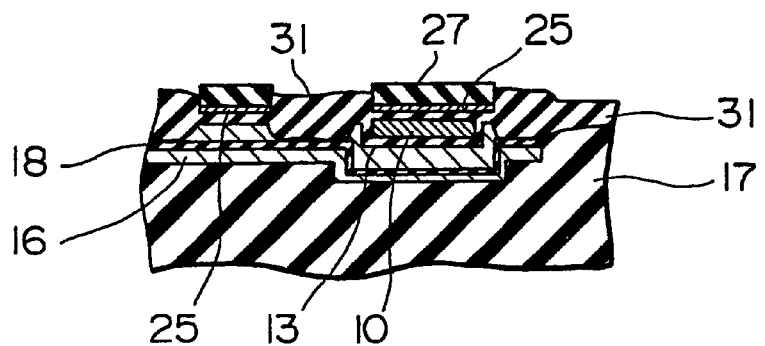

Then, as shown in FIG. 21, the back gate electrode 16 is selectively oxidized using the silicon nitride film (oxidation preventive film) 27 as an oxidation preventive mask, to form a thick oxide film 31 on the back gate electrode 16. At this time, the poly-Si film 25 is first oxidized, and then the back gate electrode 16 is oxidized through the back gate oxide film grown by sacrifice oxidation. The oxidized amount may be determined in consideration of the remaining film thickness of the back gate electrode after oxidation, cut-off of the oxide film in the field area depending on the processed amount of a HF based solution (which will be described later) after oxidation, and the like. Here, of the back gate electrode 16, the poly-Si film 16a (thickness: less than 200 nm) positioned on the $Si_3N_4$ film 18 as the impurity diffusion preventive layer (oxidation stopper) is entirely oxidized. Since the poly-Si film 25 is all oxidized at this time, the thickness of the oxide film on the back gate electrode 16 in the field area becomes about 560 nm {[50 nm (thickness of the poly-Si film 25)+200 nm (consumption of the back gate electrode 16)]×2+60 nm=560 nm}.

The oxidation condition may be set such that the temperature is 950° C.; the atmosphere is $H_2/O_2$=5/5 slm; and the oxidation time is (4+⅓) hr. In addition, oxidation may be actually performed for a time longer than the above specific time because oxidation is automatically stopped in the thickness direction by the oxidation stopper layer 18 formed in the back gate electrode 16. This makes it possible to increase the process margin. To be more specific, even by oxidation with the increased process margin, the portion (thickness: less than 100 nm) of the back gate electrode 16 in the field area, positioned under the oxidation stopper layer 18, remains as being not oxidized.

Figure 22:
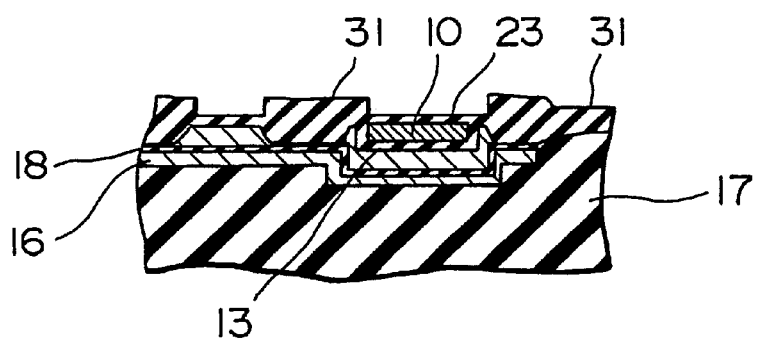

Then, as shown in FIG. 22, the silicon nitride film 27 is selectively removed by etching using boiled phosphoric acid, and the poly-Si film 25 is also removed by isotropic dry etching.

Figure 23:
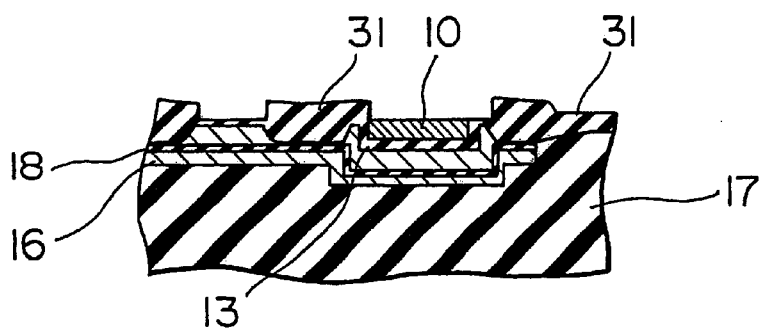

As shown in FIG. 23, the sacrifice oxide film 23 is then removed by a HF based solution, to expose the surface of the SOI layer 10.

Figure 24:
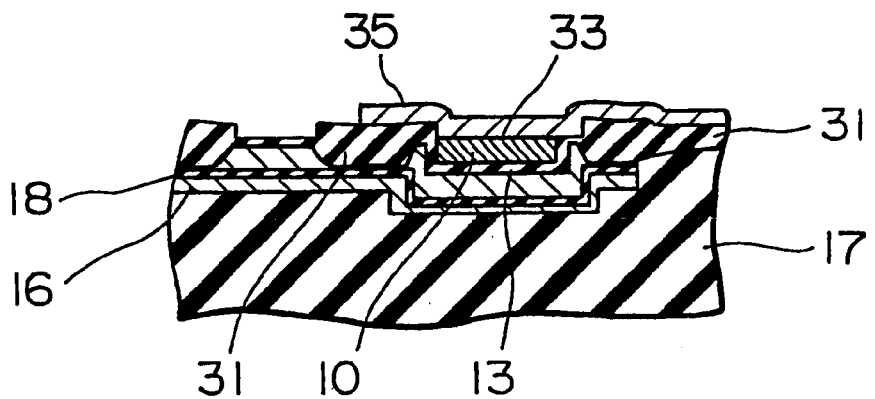

After that, as shown in FIG. 24, a front gate oxide film 33 is formed on the surface of the SOI layer 10. A poly-Si film is formed on both the front gate oxide film 33 and the thick oxide film 31, and is then processed to form a front gate electrode 35 on both the front gate oxide film 33 and the thick oxide film 31.

The above step is followed by formation of a LDD region (not shown), a LDD-spacer ($SiO_2$), and a diffusion layer.

Figure 25:
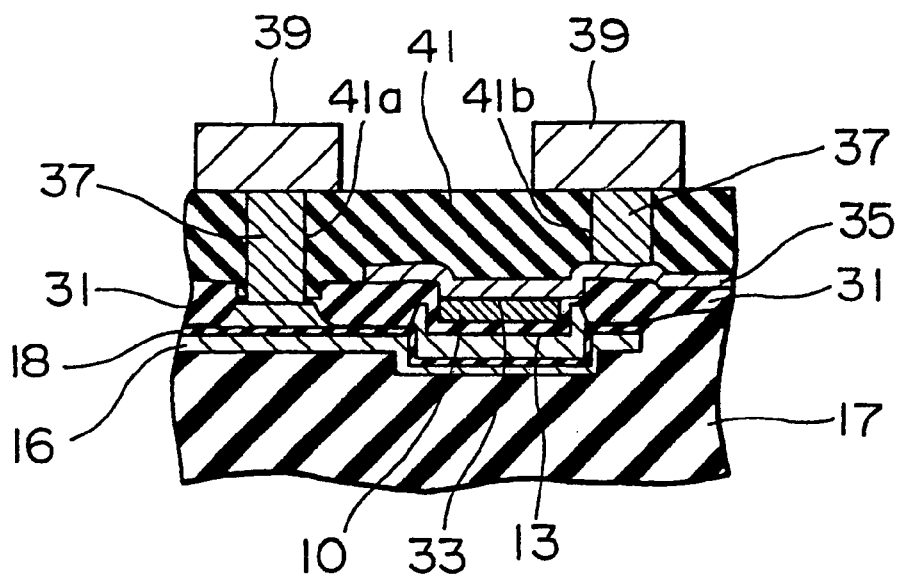
Figure 26A:
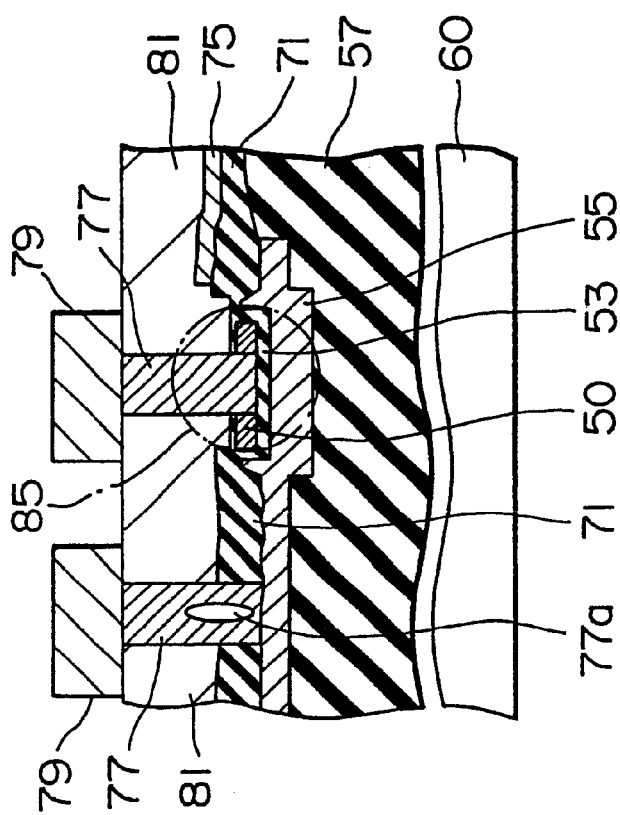
FIGS. 26A and 26B are sectional views showing a process of fabricating a semiconductor device.
Figure 26B:
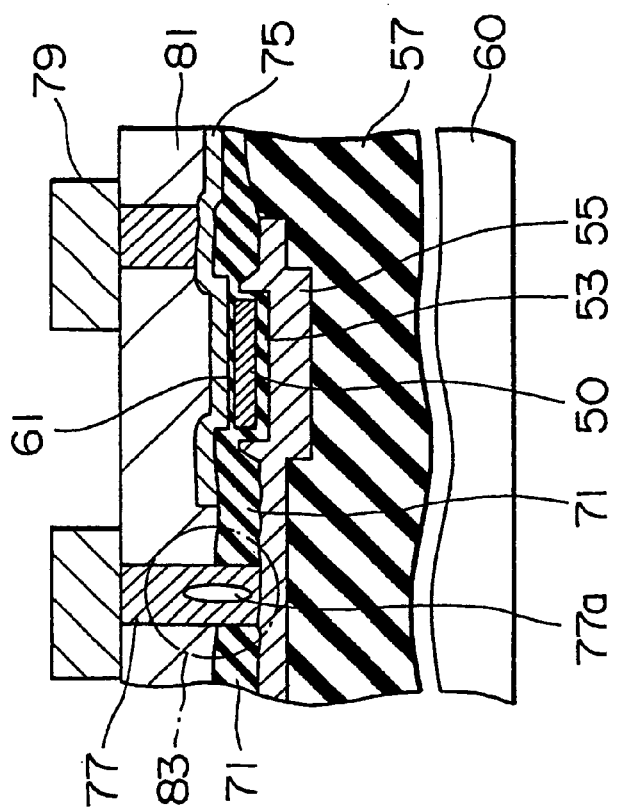

As shown in FIG. 25, an interlayer dielectric film 41 is deposited on both the thick oxide film 31 and the front gate electrode 35. Connection holes (contact holes) 41a and 41b are formed in the interlayer dielectric film 41, and are then filled with W plugs 37. On the W plugs 37 and the interlayer dielectric film 41 are formed Al interconnections 39. In this state, one Al interconnection 39 is connected to the front gate electrode 35 through one W plug 37 and the other Al interconnection 39 is connected to the back gate electrode 16 through the other W plug 37.

Figure 27A:
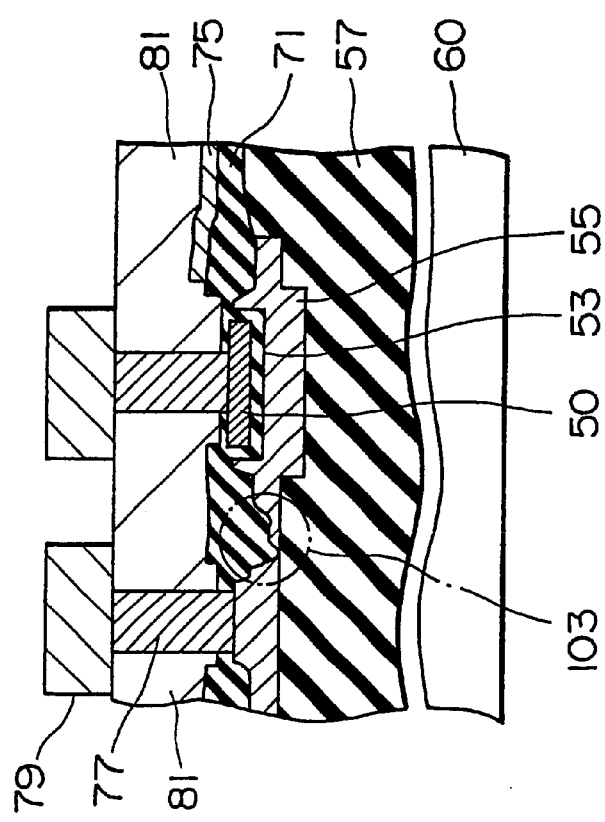
FIGS. 27A and 27B are sectional views illustrating problems in the process of fabricating a semiconductor device shown in FIGS. 26A and 26B.
Figure 27B:
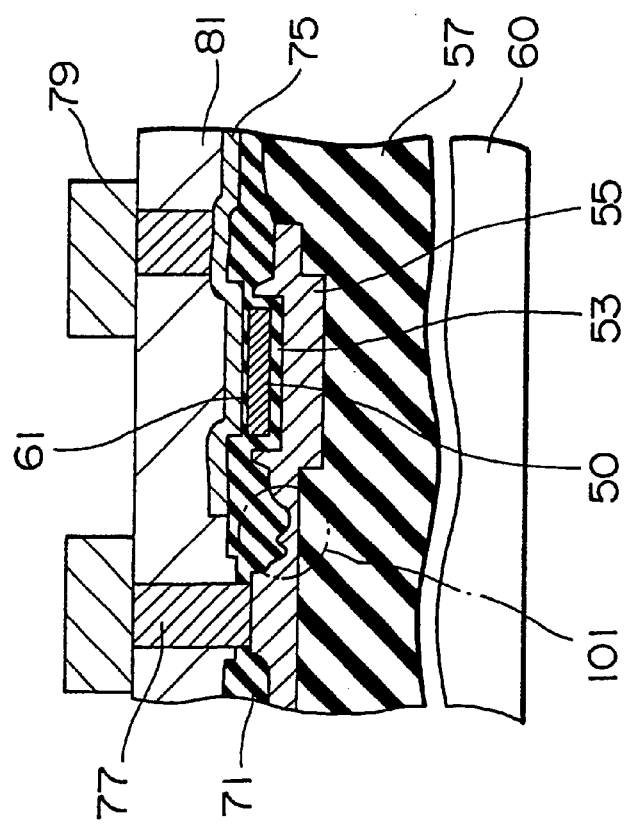

In the process of fabricating a semiconductor device according to the third embodiment, by forming the $Si_3N_4$ film 18 on the poly-Si film 16a at the step shown in FIG. 14, the back gate electrode 16 composed of a semiconductor buried in the SOI substrate is configured to be of a multi-layered structure containing the $Si_3N_4$ film 18 functioning as a layer for preventing diffusion of an impurity. Accordingly, it is possible to obstruct, by the diffusion preventive layer 18, growth of grains of poly-Si of the back gate electrode 16 having been treated at high temperatures in the wafer bonding process. As a result, it is possible to eliminate the phenomenon in which oxidation abnormally proceeds along grain boundaries of poly-Si as in the related art structure, and hence to stop oxidation by the $Si_3N_4$ film 18. That is, the $Si_3N_4$ film 18 acts as an oxidation stopper when the back gate electrode 16 is oxidized from the front surface side at the step shown in FIG. 21. Consequently, it is possible to prevent the back gate electrode from being partially thinned as shown in FIG. 27A, and hence to prevent an local increase in sheet resistance, and also to prevent disconnection of the back gate as shown in FIG. 27B. These contribute to improvement in reliability in fabrication of the back gate electrode, improvement in yield, suppression of lowering of the operating speed of a semiconductor device, realization of high speed operation of a semiconductor element, reduction in power consumption, and further enhancement of integration.

In the case where the back gate electrode 16 is made from p+poly-Si film doped with B, the $Si_3N_4$ film 18 prevents dopant (B) from being precipitated at an interface between the back gate electrode 16 and the oxide film 31 upon formation of the thick oxide film 31 by oxidizing the back gate electrode 16 from the front surface side at the step shown in FIG. 21. This is effective to prevent the final sheet resistance Rs from being increased more than a sheet resistance which should be inherent to the final back gate electrode having the thickness corresponding to that of the poly-Si film.

In this embodiment, since the $Si_3N_4$ film 18 is formed as an oxidation stopper in the back gate electrode 16, the oxidized amount of the back gate electrode 16 is not required to be controlled on the basis of the process condition such as an oxidation time at the step shown in FIG. 21, so that the thickness of the oxide film 31 can be set on the basis of the initial set thickness of poly-Si film 16a in the back gate electrode 16 having the multilayered structure. This is effective to improve the process margin.

Even in the fabrication process according to the third embodiment, the same effect as that in the process of fabricating a semiconductor device according to the first embodiment. That is, even when the thick oxide film is grown on the back gate electrode in the field area by selectively oxidizing the back gate electrode in the field area, a contact reaching the back gate electrode can be formed without increasing an aspect ratio of the contact.

In the fabrication process according to the third embodiment, a structure composed of the back gate electrode 16 is buried in the bonded SOI substrate 21; however, the structure is not limited to the back gate electrode 16 but may be represented by an interconnection. In this case, it is possible to improve an interconnection yield by preventing a disconnection or an abnormal increase in resistance of the interconnection.

The numeral values indicating process conditions or the like used in the third embodiment can be suitably changed in accordance with a design rule of a desired semiconductor device.

The semiconductor device in the fourth embodiment shown in FIG. 10B can be fabricated in accordance with a process substantially similar to the process of fabricating a semiconductor device according to the third embodiment.

In the third and fourth embodiments, the thin $Si_3N_4$ film 18 having a tunnel effect is used as a layer for preventing diffusion of an impurity formed in the poly-Si film as the back gate electrode 16; however, such a film can be replaced with a different film having an effect of preventing diffusion of an impurity, for example, a thin SiON film.

Further, in these embodiments, only one layer for preventing diffusion of an impurity is formed in the back gate electrode 16; however, two or more of layers for preventing diffusion of an impurity may be formed in the back gate electrode 16.

In addition, a thin $SiO_2$ film for preventing growth of grains of poly-Si may be used, though it is weak in the effect of preventing diffusion of an impurity. The $SiO_2$ film can be expected to exhibit somewhat an effect of preventing diffusion of an impurity. To be more specific, the thin $SiO_2$ film does not function as an oxidation stopper when the poly-Si film constituting the back gate electrode 16 is oxidized from the front gate 35 side but it can exhibit an effect of suppressing abnormally abrupt growth of an oxide film along grain boundaries of poly-Si.

As described above, according to the present invention, it is possible to form a contact reaching a back gate electrode without increasing an aspect ratio of the contact even when a thick oxide film is grown on the back gate electrode in the filed area by selectively oxidizing the back gate electrode in the field area. Further, according to the present invention, since the layer for preventing diffusion of an impurity is formed in a back gate electrode or structure, it is possible to suppress a disconnection or an increase in sheet resistance of the back gate electrode or structure even when a thick oxide film is grown on the back gate electrode or structure in the field area by selectively oxidizing the back gate electrode or structure in the field area.

While the preferred embodiments of the present invention have been described using specific terms, such description is for illustrative purposes only, and it is understood that changes and variations may be made without departing from the spirit or scope of the following claims.

What is claimed is:

1. A semiconductor device of a SOI type in which a structure made from a semiconductor material is buried, comprising:

a layer for preventing diffusion of an impurity, said layer being formed in said structure to isolate one region of said structure from another region of said structure; and an oxide film selectively grown on said structure except for said one region of said structure, wherein said structure is a back gate electrode or an interconnection layer.

2. A semiconductor device according to claim 1, wherein said partial region of said structure is a region in which a contact reaching said buried structure is to be formed.

3. A semiconductor device comprising:

a SOI substrate having a SOI layer, in which a structure made from a semiconductor material is buried;

a layer for preventing diffusion of an impurity, said layer being formed in said structure to isolate one region of said structure from another region of said structure;

a thick oxide film formed on said structure by selectively oxidizing said structure using as a mask an oxidation preventive film formed both on said SOI layer and on a region in which a contact reaching said structure is to be formed;

an interlayer dielectric film formed on said structure, said SOI layer and said thick oxide film; and a plurality of connection holes formed in said interlayer dielectric film and including at least a connection hole positioned on said region in which said contact is to be formed.

4. A semiconductor device of a SOI type in which a structure made from a semiconductor material is buried, comprising:

a layer for preventing diffusion of an impurity, said layer being formed in said structure to separate one region of said structure from another region of said structure; and an oxide film selectively oxidizing said structure except for said one region of said structure isolated from said another region of said structure by said diffusion preventive layer.

5. A semiconductor device according to claim 4, wherein said diffusion preventive layer is disposed within a conductive layer, having a tunnel effect.

6. A semiconductor device according to claim 4, wherein said structure is a back gate electrode or an interconnection layer.

* * * * *

UNITED STATES PATENT AND TRADEMARK OFFICE
CERTIFICATE OF CORRECTION

PATENT NO.   : 6,359,312 B1  Page 1 of 1
DATED        : March 19, 2002
INVENTOR(S)  : Hiroshi Komatsu It is certified that error appears in the above-identified patent and that said Letters Patent is hereby corrected as shown below:

<u>Title page,</u>
Item [57], ABSTRACT,
Line 15, replace "filed" with -- field --.

Signed and Sealed this

Twenty-fifth Day of March, 2003

JAMES E. ROGAN
*Director of the United States Patent and Trademark Office*